United States Patent
Wang et al.

(10) Patent No.: US 9,224,447 B2
(45) Date of Patent: Dec. 29, 2015

(54) GENERAL STRUCTURE FOR COMPUTATIONAL RANDOM ACCESS MEMORY (CRAM)

(71) Applicant: Regents of the University of Minnesota, Minneapolis, MN (US)

(72) Inventors: Jian-Ping Wang, Shoreview, MN (US); Jonathan D. Harms, White Plains, NY (US)

(73) Assignee: Regents of the University of Minnesota, Minneapolis, MN (US)

( * ) Notice: Subject to any disclaimer, the term of this patent is extended or adjusted under 35 U.S.C. 154(b) by 0 days.

(21) Appl. No.: 14/259,568

(22) Filed: Apr. 23, 2014

(65) Prior Publication Data
US 2014/0334216 A1    Nov. 13, 2014

Related U.S. Application Data

(60) Provisional application No. 61/815,445, filed on Apr. 24, 2013.

(51) Int. Cl.
*G11C 11/16* (2006.01)
*G11C 5/08* (2006.01)

(52) U.S. Cl.
CPC . *G11C 11/16* (2013.01); *G11C 5/08* (2013.01)

(58) Field of Classification Search
CPC ................................ G11C 11/15; G11C 11/16
USPC .......................................... 365/158, 171, 187
See application file for complete search history.

(56) References Cited

U.S. PATENT DOCUMENTS

| | | | | |
|---|---|---|---|---|
| 6,914,806 B2* | 7/2005 | Kunikiyo | | 365/158 |
| 8,902,644 B2* | 12/2014 | Sakimura et al. | | 365/158 |
| 2004/0160809 A1* | 8/2004 | Lin et al. | | 365/158 |
| 2010/0097845 A1* | 4/2010 | Sakimura et al. | | 365/158 |
| 2010/0238719 A1* | 9/2010 | Nebashi et al. | | 365/158 |
| 2011/0069534 A1* | 3/2011 | Inaba | | 365/158 |

OTHER PUBLICATIONS

Behin-Aein et al, Proposal for an all-spin logic device with built-in memory. Nature Nanotechnology vol. 5, pp. 266-270, 2010.
Harms et al., SPICE Macromodel of Spin-Torque-Transfer-Operated Magnetic Tunnel Junctions, IEEE Transactions on Electron Devices, vol. 57, pp. 1425-1430, 2010.
Ikeda et al., A perpendicular-anisotropy CoFeB—MgO magnetic tunnel junction, Nature materials vol. 9, pp. 721-724, 2010.
Kautz, Cellular logic-in-memory arrays, IEEE Transactions on Computers, vol. C-18, No. 8, pp. 719-727, 1969.

(Continued)

*Primary Examiner* — Son Mai
(74) *Attorney, Agent, or Firm* — Westman, Champlin & Koehler, P.A.; Theodore M. Magee

(57) ABSTRACT

A cell array includes a logic connection line, a plurality of bit selection lines, and a plurality of cells. Each cell includes a memory element connected to a respective bit selection line and a logic switching element that selectively connects the memory element to the logic connection line. When logic switching elements of multiple separate cells connect their respective memory elements to the logic connection line, the memory elements connected to the logic connection line operate as a logic device with an output of the logic device stored in one of the memory elements.

20 Claims, 15 Drawing Sheets

(56) References Cited

OTHER PUBLICATIONS

Kinoshita et al., Bias polarity dependent data retention of resistive random access memory consisting of binary transition metal oxide, Applied Physics Letters vol. 89, 103509, 4 pages, 2006.
Lyle et al., Magnetic Tunnel Junction Logic Architecture for Realization of Simultaneous Computation and Communication, IEEE Transactions on Magnetics, vol. 47, No. 10, pp. 2970-2973, 2011.
Meng et al., A spintronics full adder for magnetic CPU, IEEE Electron Device Letters, vol. 26, No. 6, pp. 360-362, 2005.
Saraswat et al., Effect of Scaling of Interconnections on the Time Delay of VLSI Circuits, IEEE Journal of Solid-State Circuits, vol. SC-17, No. 2, pp. 275-280, 1982.
Walus et al., Circuit design based on majority gates for applications with quantum-dot cellular automata, IEEE 0-7803-8622-1, pp. 1354-1357, 2005.
Wolf et al., The Promise of Nanomagnetics and Spintronics for Future Logic and Universal Memory, Proceedings of the IEEE, vol. 98, No. 12, pp. 2155-2168, 2010.
Yao et al., Magnetic Tunnel Junction-Based Spintronic Logic Units Operated by Spin Transfer Torque, IEEE Transactions on Nanotechnology, vol. 11, No. 1, pp. 120-126, 2012.
Yuasa et al., Giant tunneling magnetoresistance up to 410% at room temperature in fully epitaxial Co Mg O Co magnetic tunnel junctions with bcc Co(001) electrodes, Applied Physics Letters vol. 89, 042505, 4 pages, 2006.
Zhu, Magnetoresistive Random Access Memory: The Path to Competitiveness and Scalability, Proceedings of the IEEE, vol. 96, No. 11, pp. 1786-1798, 2008.
Allwood et al., Magnetic Domain-Wall Logic, Science vol. 309, pp. 1688-1692, 2005.
Borghetti et al., 'Memristive' Switches Enable 'Stateful' Logic Operations Via Material Implication, Nature vol. 464, pp. 873-876, 2010.
Cowburn et al., Room Temperature Magnetic Quantum Cellular Automata, Science vol. 287, pp. 1466-1468, 2000.
Franzon et al., FreePDK—NCSU EDA Wiki available at http://eda.ncsu.edu/wiki/freepdk, 1 page, 2008.
Gallagher et al., Development of the Magnetic Tunnel Junction MRAM at IBM: From First Junctions to a 16-Mb MRAM Demonstrator Chip, IBM Journal of Research and Development vol. 50, No. 1, pp. 5-23, 2006.
Imre et al., Majority Logic Gate for Magnetic Quantum-Dot Cellular Automata, Science vol. 311, pp. 205-208, 2006.
Lavrijsen et al., Magnetic Ratchet for Three-Dimensional Spintronic Memory and Logic, Nature vol. 493, pp. 647-650, 2013.
Lin et al., 45nm Lower Power CMOS Logic Compatible Embedded STT MRAM Utilizing a Reverse-Connection 1T/1MTJ Cell, 2009 IEEE International Electron Devices Meeting (IEDM) 1-4, 2009, doi:10.1109/IEDM.2009.5424368.
Liu et al., Power Consumption Estimation in CMOS VLSI Chips, IEEE Journal of Solid-State Circuits vol. 29, No. 6, pp. 663-670, 1994.
Lyle et al. Direct Communication Between Magnetic Tunnel Junctions for Nonvolatile Logic Fan-Out Architecture, Applied Physics Letters vol. 97, 152504, 2010.
Matsunaga et al., Fabrication of a Nonvolatile Full Adder Based on Logic-in-Memory Architecture Using Magnetic Tunnel Junctions, Applied Physics Express vol. 1, 091301, 2008.
Ney et al., Programmable Computing with a Single Magnetoresistive Element, Nature vol. 425, pp. 485-487, 2003.
Parkin et al., Magnetic Domain-Wall Racetrack Memory, Science vol. 320, pp. 190-194, 2008.
Patil et al., Spintronic Logic Gates for Spintronic Data Using Magnetic Tunnel Junctions, IEEE International Conference on Computer Design, pp. 125-131, doi:10.1109/ICCD.2010-5647611, 2010.
Strukov et al., The Missing Memristor Found, Nature vol. 453, pp. 80-83, doi:10.1038/nature06932, 2008.
Varga et al., Non-Volatile and Programmable MQCA-Based Majority Gates, Device Research Conference, 2 pages, 2009.
Xia et al., Memristor—CMOS Hybrid Integrated Circuits for Reconfgurable Logic, Nano Letters vol. 1, pp. 3640-3645, 2009.

\* cited by examiner

| Inputs | | MTJ 130 Output | | | |
|---|---|---|---|---|---|
| MTJ 110 | MTJ 120 | AND | OR | NAND | NOR |
| 0 | 0 | 0 | 0 | 1 | 1 |
| 0 | 1 | 0 | 1 | 1 | 0 |
| 1 | 0 | 0 | 1 | 1 | 0 |
| 1 | 1 | 1 | 1 | 0 | 0 |
| Preset State of MTJ 130 | | 1 | 1 | 0 | 0 |
| Example $V_{MTJ}$ | | -2.1 V | -1.8 V | 2.1 V | 1.8 V |

FIG. 3

GENERAL STRUCTURE FOR COMPUTATIONAL RANDOM ACCESS MEMORY (CRAM)

CROSS-REFERENCE TO RELATED APPLICATION

The present application is based on and claims the benefit of U.S. provisional patent application Ser. No. 61/815,445, filed Apr. 24, 2013, the content of which is hereby incorporated by reference in its entirety.

This invention was made with government support under DMR-0819885 awarded by the National Science Foundation (NSF) and under DARPA-BAA-10-42 awarded by the Department of Defense (Defense Advanced Research Projects Agency). The government has certain rights in the invention.

BACKGROUND

In modern processor (e.g. CPU) architecture, data is fetched from memory, travels through interconnects, is processed in a logic circuit, and is stored back into memory. The requirement for data to be physically moved from memory and written back into memory demands significant power consumption and delays.

SUMMARY

In accordance with one embodiment, a cell array includes a logic connection line, a plurality of bit selection lines, and a plurality of cells. Each cell includes a memory element connected to a respective bit selection line and a logic switching element that selectively connects the memory element to the logic connection line. When logic switching elements of multiple separate cells connect their respective memory elements to the logic connection line, the memory elements connected to the logic connection line operate as a logic device with an output of the logic device stored in one of the memory elements.

In accordance with a further embodiment, a logic-memory cell includes a first transistor connected between a logic connection line and a common node and connected to a logic bit line. A second transistor is connected between a memory bit line and the common node and is connected to a memory word line. A device capable of having its resistance changed by a current is connected between the common node and a bit selection line.

A method includes setting a first set of logic bit lines to a first state to connect a first set of memory elements to a logic connection line. A first set of bit selection lines are then set to respective states to cause the first set of memory elements to perform a first logic function and to store a result of the first logic function in one of the first set of memory elements.

BRIEF DESCRIPTION OF THE DRAWINGS

FIG. 3 is a table that illustrates logic functions that can be performed utilizing device 100.

DETAILED DESCRIPTION

In the embodiments describe below, a new architecture is provided to realize computation without data transfer between a memory and a logic circuit. In this application, this architecture is referred to as computational random access memory (CRAM). This general architecture can be implemented using a variety of available and proposed devices, including magnetic tunnel junctions (MTJs), memristors, all spin-logic devices, or even traditional CMOS based SRAM.

Though the CRAM structure is not device specific, a specific implementation based on magnetic RAM (MRAM) is here presented which could provide an order of magnitude better performance than any current technology. MRAM is currently used as a memory device. It has the potential to be very high density (~4F2), high speed (low gigahertz), and low power (zero leakage power). Before the present innovation, researchers from both academia and industry have only pursued and thought of using MRAM as a memory device. However, in the embodiments described below, the MRAM structure is modified to provide a structure that not only stores data, but also performs computations directly in memory by applying a series of voltage pulses to bit lines. An MRAM based CRAM processor has the following advantages over current processors: 1) CRAM is highly efficient at parallel operations, and computations can be performed on entire arrays of memory simultaneously; 2) CRAM is ultra-low power because computations are performed at the equivalent of only a single memory write, eliminating power consumption in the memory read, computation, and interconnects; 3) MRAM based CRAM is extremely dense and requires only two transistors for one randomly accessible bit and one logic gate, which is an 80% reduction in the size of circuitry when compared with a non-CRAM implementation.

Figure 1A:
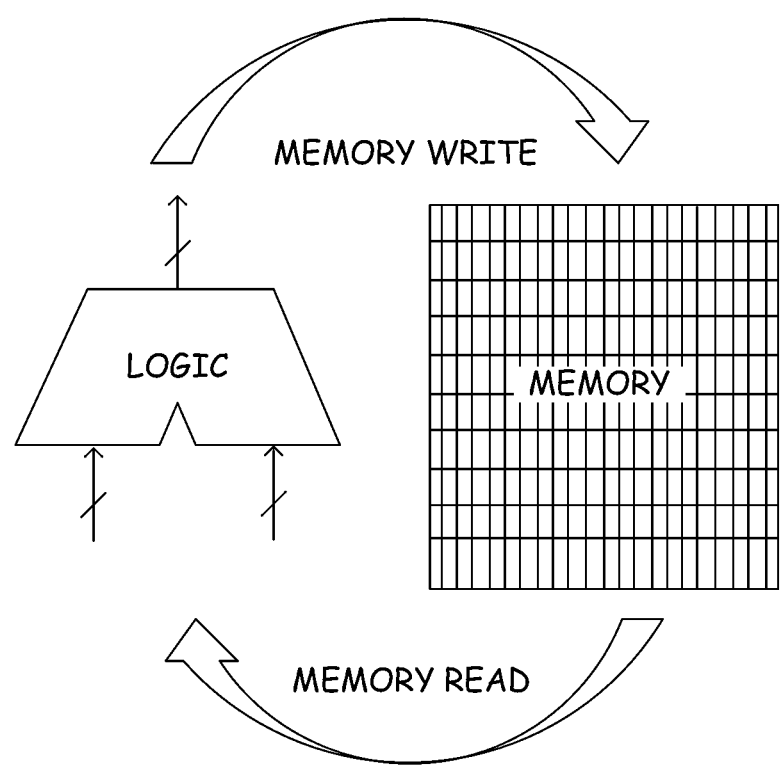
FIG. 1A depicts modern CPU architecture where data is fetched from memory, travels through interconnects, is processed in a logic circuit, and is stored back into memory.
Figure 1B:
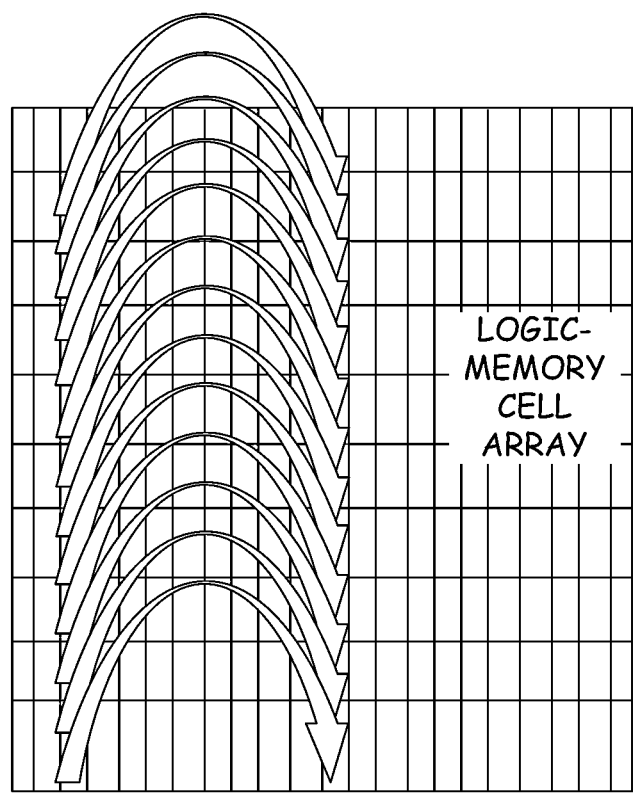
FIG. 1B shows a CRAM architecture of various embodiments which provides the ability to perform computations without the data leaving memory.

FIGS. 1a and 1b highlight the efficiency gains with the CRAM architecture. FIG. 1a depicts modern CPU architecture where data is fetched from memory, travels through interconnects, is processed in a logic circuit, and is stored back into memory. The requirement for data to be physically moved from memory and written back into memory demands significant power consumption and delays.

In contrast, FIG. 1b shows the CRAM architecture which provides the ability to perform computations without the data leaving memory. This is accomplished by linearly combining input state variables (or some transform of them) and using the combination to directly set (change or not change) either a volatile (such as the case of an SRAM cell) or a non-volatile (such as the case of an MRAM cell) memory element which then contains the output of the logic operation. Table I below gives examples of different state variables for different technologies that can be used with the CRAM architecture.

TABLE I

| Technology | State Variable | Conversion | Combined Variable | Threshold Detector |
|---|---|---|---|---|
| Voltage Controlled Logic | Resistance | V = IR | Current | MTJ |
| Memristor Logic | Resistance | V = IR | Current | Memristor |
| All-Spin Logic[1] | Spin | — | Spin | Unstable Magnet |
| CMOS 6T SRAM | Voltage | $I_d = K'W/L[(V_{gs} - V_t)V_{ds} - V_{ds}^2/2]$ | Current | Inverter |

Figure 2:
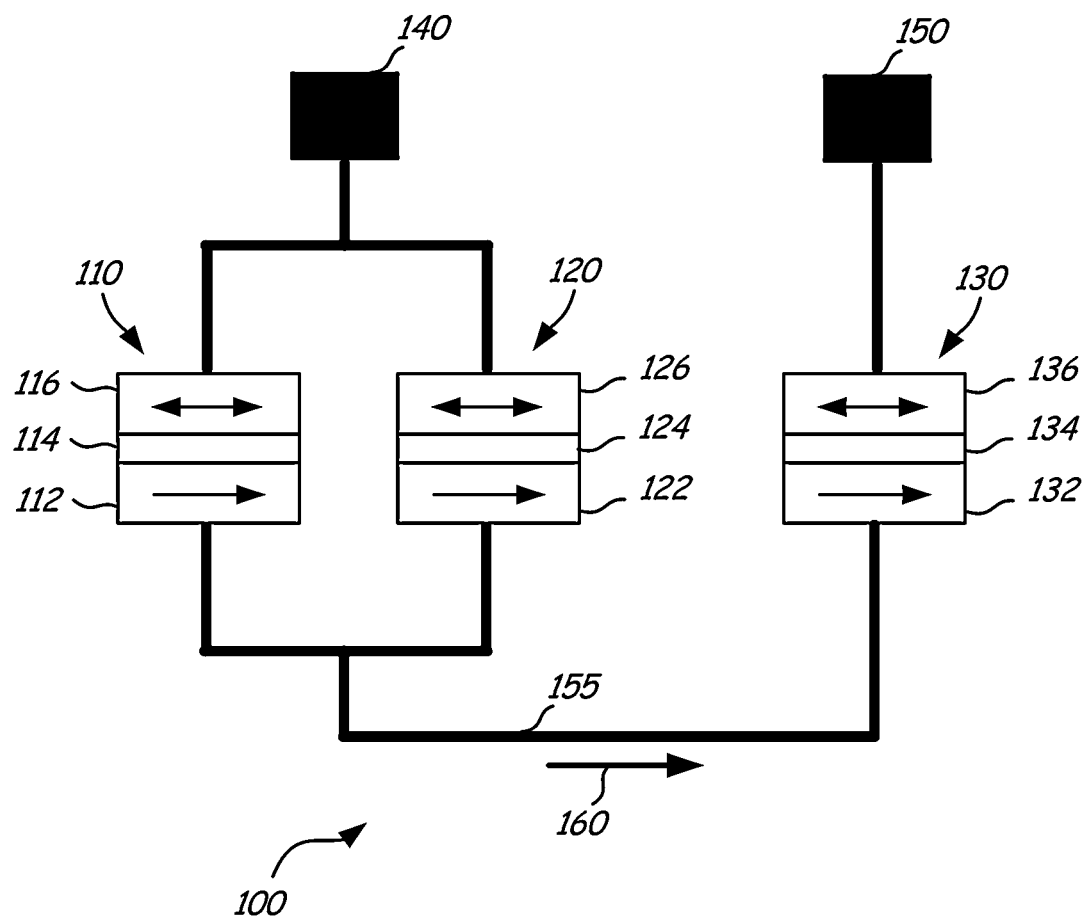
FIG. 2 provides an example of VCL using MTJs.

FIG. 2 demonstrates this principle using magnetic tunneling junction's (MTJs) as an example. In FIG. 2 a device 100 includes a first input MTJ 110, a second input MTJ 120, and an output MTJ 130. MTJs 110 and 120 are connected in parallel, and MTJ 130 is connected in series to the outputs of MTJs 110 and 120. Additionally, a first electrode 140 is connected to MTJs 110 and 120, a second electrode 150 is connected to MTJ 130, and a third electrode 155 connects MTJs 110, 120, and 130. A voltage can be applied across device 100 utilizing electrodes 140, 150, and 155. In one particular embodiment, a bias voltage, $V_{MTJ}$, is connected to electrode 140, and an electrical ground is connected to electrode 150.

MTJ 110 includes a fixed layer 112, a nonmagnetic layer 114, and a free layer 116. When the relative magnetic orientations of layers 112 and 116 are parallel, MTJ 110 has a low resistance. When the relative magnetic orientations of layers 112 and 116 are antiparallel, MTJ 110 has a high resistance. Similar to MTJ 110, MTJ 120 includes a fixed layer 122, a nonmagnetic layer 124, and a free layer 126, and MTJ 130 includes a fixed layer 132, a nonmagnetic layer 134, and a free layer 136. In certain embodiments, MTJ 110 and 120 corresponds to a logic state 0 when the resistance is low, and corresponds to a logic state 1 when the resistance is high. The magnetic orientation of free layers 116 and 126 can be controlled by using spin-transfer-torque (STT) switching as discussed below. For example, CMOS components are added to device 100 to individually set the logic states of the MTJ 110 and 120 using STT switching.

MTJs 110, 120 and 130 could be replaced by a giant magnetoresistance cell that consists of a fixed layer, a conductive non-magnetic layer and a free layer.

When a bias voltage is applied across device 100 (e.g. by utilizing electrodes 140 and 150), an electric current 160 is generated that flows through MTJ 130. The electric current, I, can be calculated utilizing equation 1 below.

$$I = \frac{V_{MTJ}}{\frac{R_{110} \cdot R_{120}}{R_{110} + R_{120}} + R_{130}} \quad \text{Equation 1}$$

Where $V_{MTJ}$ is the bias voltage across electrodes 140 and 150, R110 is the resistance of MTJ 110, R120 is the resistance of MTJ 120, and R130 is the resistance of MTJ 130.

In an embodiment, MTJ 130 is associated with one or more threshold current values. For example, if electric current 130 is larger than or equal to the threshold current, MTJ 130 will either be maintained at or be switched to a high resistance (e.g. logic state 1). If a reverse current is applied that is larger than or equal to the threshold current, MTJ 130 will either be maintained at or be switch to a low resistance (e.g. logic state 0). Note that although the parallel state of MTJ 130 has been bound to logic state 0 and the anti-parallel state of MTJ 130 has been bound to logic state 1 above, these bindings are arbitrary and an alternative binding may be used in which the parallel state of MTJ 130 is bound to a logic state 1 while the anti-parallel state of MTJ 130 is bound to logic state 0.

FIG. 3 is a table 200 that illustrates logic functions that can be performed utilizing device 100. Column 202 shows logic states for the first input MTJ 110, and column 204 shows logic states for the second input MTJ 120. Row 206 shows preset logic states for the output MTJ 130, and row 208 shows example bias voltages, $V_{MTJ}$. Bias voltages 208 are dependent upon the particular details of the fabrication of the device. Embodiments of the present disclosure are not limited to any particular bias voltages, and can include any bias voltages. The specific examples shown in FIG. 3 are given for illustration purposes only. Additionally, it should be noted that the bias voltages applied to the output MTJ 130 may be manipulated by changing the connections within the device. For example, FIG. 2 shows current 160 entering the output MTJ 130 from the fixed layer 132, and exiting from the free layer 136. In another embodiment, device 100 is constructed such that current 160 enters the output MTJ 130 from the free layer 136, and exits from the fixed layer 132.

As can be seen in rows 206 and 208 of FIG. 3, the AND function is illustratively performed by presetting the state of MTJ 130 to a high resistance/logic state 1, and applying a bias voltage of −2.1 volts. Column 210 shows the resulting state of the output MTJ 130 when performing the AND function. When either one or both of the input MTJs 110 and 120 has a low resistance/logic state 0 (shown in columns 202 and 204), the electric current (e.g. current 160 in FIG. 2) that flows through the output MTJ 130 exceeds the threshold current such that the output MTJ 130 is switched from a high resistance/logic state 1 to a low resistance/logic state 0. However, when both of the input MTJs 110 and 120 have a high resistance/logic state 1, the electric current that flows through the output MTJ 130 does not exceed the threshold current, and the output MTJ 130 stays at its preset high resistance/logic state 1.

The OR function is illustratively performed by presetting the state of MTJ 130 to a high resistance/logic state 1, and applying a bias voltage of −1.8 volts. Column 212 shows the resulting state of the output MTJ 130 when performing the OR function. When either one or both of the input MTJs 110 and 120 has a high resistance/logic state 1, the electric current that flows through the output MTJ 130 does not exceed the threshold current, and the output MTJ stays at its preset high resistance/logic state 1. However, when both of the input MTJs 110 and 120 have a low resistance/logic state 0, the electric current that flows through the output MTJ 130 exceeds the threshold current such that the output MTJ 130 is switched from a high resistance/logic state 1 to a low resistance/logic state 0.

The NAND function is illustratively performed by presetting the state of MTJ 130 to a low resistance/logic state 0, and applying a bias voltage of 2.1 volts. Column 214 shows the resulting state of the output MTJ 130 when performing the NAND function. When either one or both the input MTJs 110 and 120 has a low resistance/logic state 0, the electric current that flows through the output MTJ 130 exceeds the threshold current such that the output MTJ 130 is switched from the low resistance/logic state 0 to a high resistance/logic state 1. However, when both of the input MTJs 110 and 120 have high resistances/logic state 1, the electric current that flows through the output MTJ 130 does not exceed the threshold current, and the output MTJ 130 stays at its preset low resistance/logic state 0.

The NOR function is illustratively performed by presetting the state of the MTJ 130 to a low resistance/logic state 0, and applying a bias voltage of 1.8 volts. Column 216 shows the resulting state of the output MTJ 130 when performing the NOR function. When either one or both of the input MTJs 110 and 120 has a high resistance/logic state 1, the electric current that flows through the output MTJ 130 does not exceed the threshold current, and the output MTJ stays at its preset low resistance/logic state 0. However, when both of the input MTJs 110 and 120 have low resistances/logic state 0, the current that flows through output MTJ 130 exceeds the threshold current such that the output MTJ 130 is switched from the low resistance/logic state 0 to a high resistance/logic state 1.

In addition to these 2 input logic functions, VCL is capable of performing 1 input, 3 input (majority gate function), and multi-input logic operations.

Figure 4:
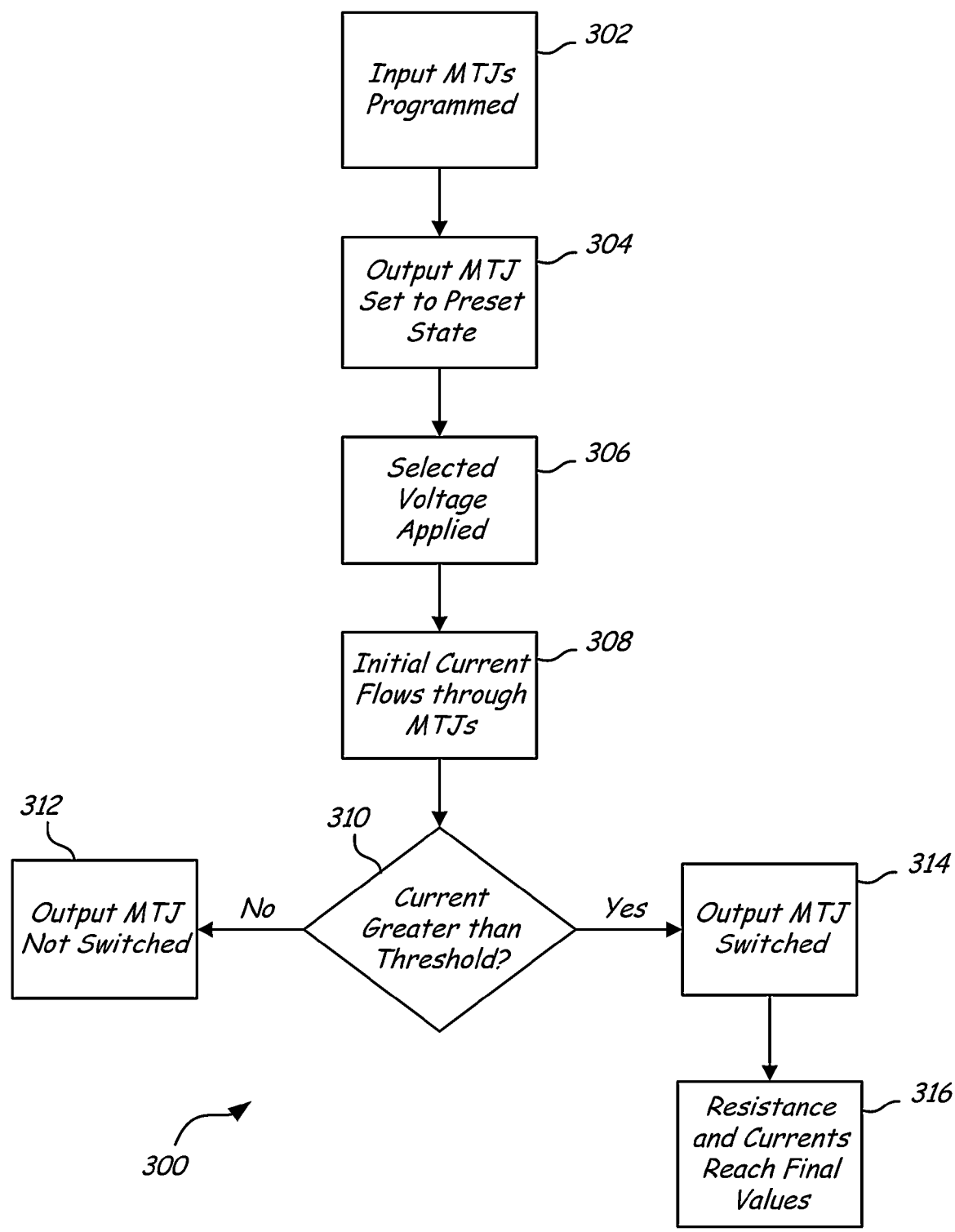
FIG. 4 is a process flow diagram of a method of utilizing MTJ devices to perform logic functions.

FIG. 4 is a process flow diagram of a method 300 of utilizing a MTJ device (e.g. device 100 in FIG. 2) to perform logic functions. At block 302, each of the input MTJs (e.g. MTJs 110 and 120 in FIG. 2) is programmed to a low resistance/logic state 0 or to a high resistance/logic state 1. At block 304, the output MTJ (e.g. MTJ 130 in FIG. 2) is set to a preset value (i.e. either low resistance/logic state 0 or high resistance/logic state 1), and at block 306, a selected bias voltage is applied. As was described above, the preset value of the output MTJ and the bias voltage are illustratively determined based on what logic function is to be performed.

At block 308, a current flows through the MTJs. The current can be calculated utilizing equation 1 above with R110, R120, and R130 being the resistance values of the initial state of MTJs 110, 120, and 130, respectively. At block 310, the method branches based on whether the current is greater than the threshold current needed to switch the magnetic orientation of the free layer of the output MTJ. If the current is not greater than the threshold current, then at block 312, the resistance/logic state of the output MTJ does not switch. If the current is greater than the threshold current, then at block 314, the resistance/logic state of the output MTJ switches. Finally, at block 316, if the output MTJ has switched, the overall resistance of the device and the currents reach their final values, which are different than the initial values. In particular, the resistance of MTJ 130 reaches a final value which may be measured by passing a current through MTJ 130. In accordance with some embodiments, this is done using external circuit elements connected to MTJ 130. In certain embodiments, there may be a time delay associated with the resistances and currents reaching their final values. These delays can be modified for example by changing properties of the MTJs or the bias voltage (e.g. a higher bias voltage may reduce the delay time).

In light of the above, it can be seen that the MTJ device 100 in FIG. 2 can be used to perform AND, OR, NAND, and NOR functions. The particular function to be performed can be selected by using an appropriate bias voltage, and presetting the output MTJ to either a low resistance/logic state 0 or a high resistance/logic state 1. It is worth highlighting that device 100 can be viewed as a combined logic-and-memory device. The input MTJs can be considered non-volatile memory devices that store data such that the data is not lost when power is removed from the input MTJs, while the output MTJs can be considered logic-memory devices that compute logic functions for the data and stores the output values in a non-volatile manner such that the data remains in the output MTJs when power is removed from the output MTJs. Therefore, device 100 allows for the incorporation of memory and logic in one device. With such combined devices, overheads and complexity of communication between processor and memory are reduced, leading to faster processing with lower power consumption.

The device shown in FIG. 2 is referred to as voltage controlled logic (VCL) because the logical operations that are implemented by the device are determined in part by the voltages applied to the device. For MRAM implementation using VCL, the input MTJs modulate the current through the output MTJ. In this case, the state variable (resistance) is converted to current, which is quasi-linearly combined, and analyzed using the output MTJ as a threshold detector and output memory. The non-linearity is introduced by the requirement that the threshold detector (output MTJ) is connected in series with the combination circuit (the parallel connection of input MTJs), however sufficient voltage margins are still easily obtained despite this non-linearity.

In FIG. 2, MTJs 110, 120 and 130 can be thought of as memory elements that are connected together to perform a logic function and to store the results of that logic function in memory 130. In accordance with one embodiment, a new cell architecture is provided that allows a memory element to be accessed as a random access memory element and to also be connected with other memory elements to form logic devices. When operated as a random access memory element, the memory element in the cell may be written to and read from. When connected with other memory elements, the memory element may be used as an input for a logic device or alternatively as an output for the logic device. In addition, the same memory element may be used as an output memory element in one logical device and then may be used as an input for a second logical device simply by controlling which cells the current cell is connected to and the voltages applied across the cells.

Figure 5:
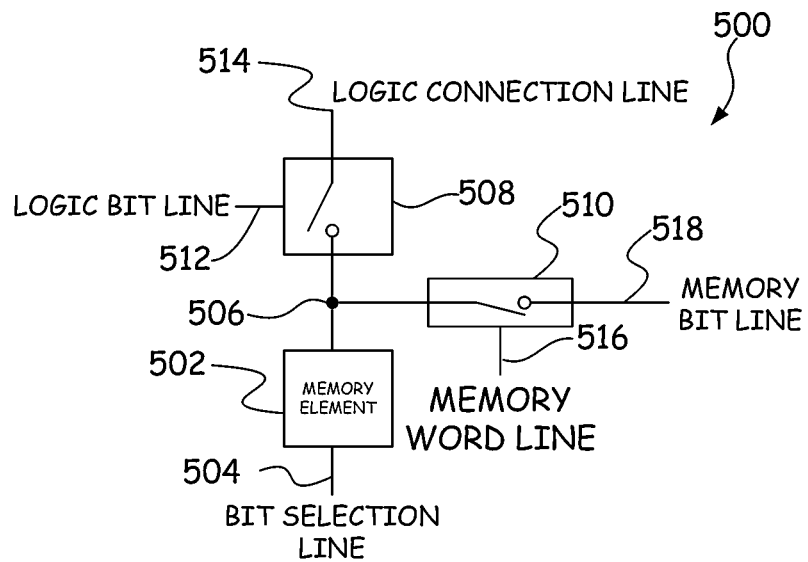
FIG. 5 provides an example of a logic-memory cell in accordance with various embodiments.

FIG. 5 provides an example of a logic-memory cell 500 in accordance with various embodiments. The logic-memory cell includes a memory element 502 that is connected to a bit selection line 504 and a common node 506. Common node 506 is connected to two controllable switching devices or elements 508 and 510, which for instance can each take the form of a transistor. Switching device 508, also referred to as a logic switching element, is controlled by a logic bit line 512 and controls whether common node 506 is connected to a logic connection line 514. Switching device 510, also referred to as a memory switching element, is controlled by a memory word line 516 and controls whether common node 506 is connected to a memory bit line 518.

When switch 508 is open and switch 510 is closed, memory bit line 518 is connected to common node 506 and a current or voltage between memory bit line 518 and bit selection line 504 can be used to set the memory of memory element 502 or to read a value from memory element 502. In accordance with some embodiments, a first current level is used to read a value from memory element 502 and a second current level is used to write a value to memory element 502. Thus, when switch 508 is open and switching element 510 is closed, memory element 502 is operated in a memory mode.

When switching element 508 is closed and switching element 510 is open, logic connection line 514 is connected to common node 506 and thereby to memory element 502. In this configuration, memory element 502 may be used as a part of a logic device, such as an input element for the logic device or as an output element of the logic device, for example, by connecting memory element 502 to other memories through logic connection line 514 as discussed further below.

Memory element 502 can take the form of any memory that can be altered based on a voltage or current between common node 506 and bit selection line 504 and that can also be read using a voltage or current between common node 506 and bit selection line 504. For example, memory element 502 can take the form of a MTJ, a memristor, any resistor-based memory cell, an all-spin logic device or even any traditional CMOS based volatile or non-volatile memory cell.

Figure 6:
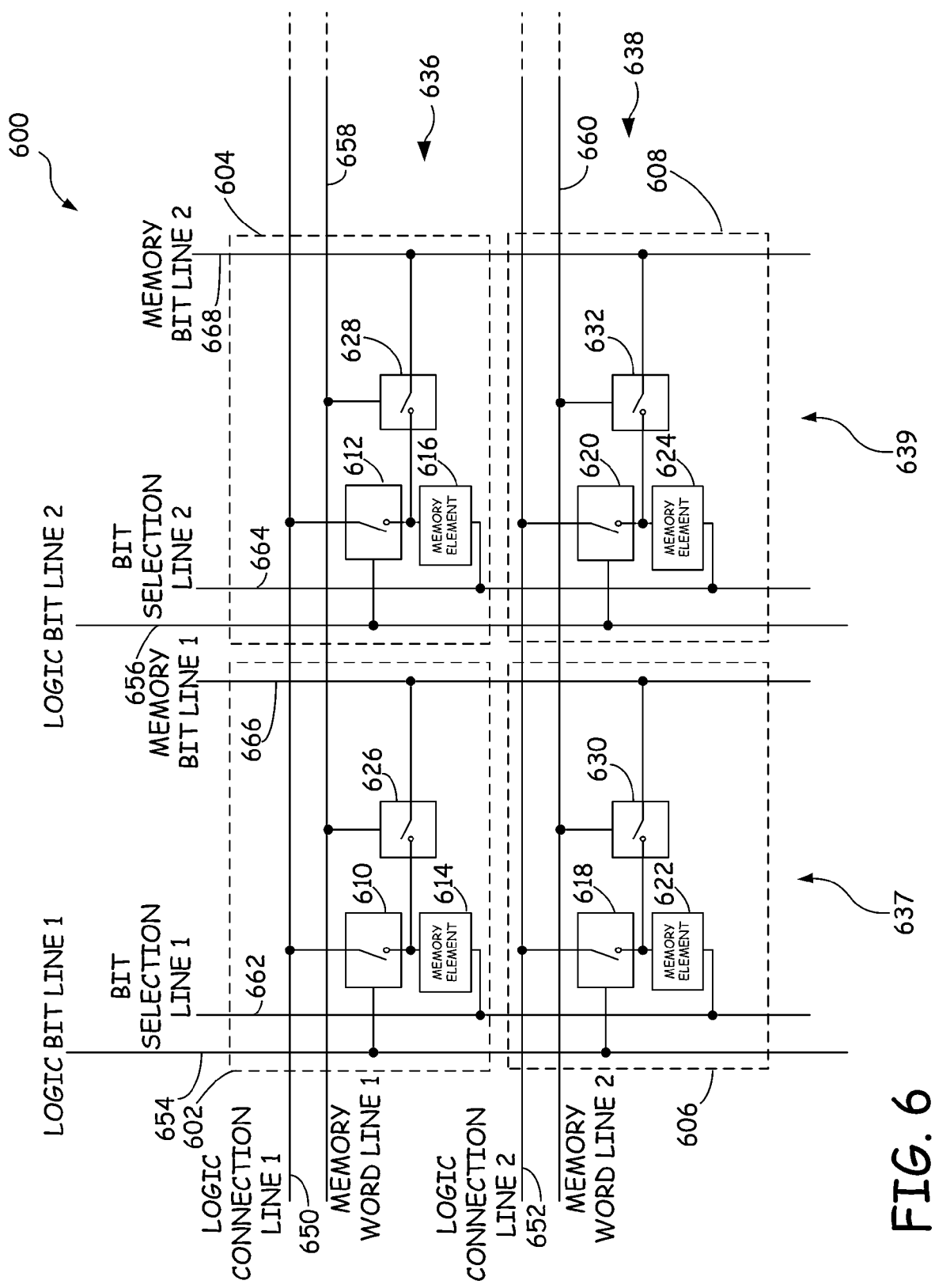
FIG. 6 provides an example of an array of logic-memory cells.

Logic-memory cell 500 can be used to form an array of cells such as cell array 600 of FIG. 6. In cell array 600, four cells 602, 604, 606, and 608, which are each identical to logic-memory cell 500 of FIG. 5 are shown. In FIG. 6, two rows of cells 636 and 638 are shown and two columns of cells 637 and 639 are shown. Those skilled in the art will recognize that cell array 600 may include any number of cells organized in any desired number of columns and rows. In addition, the designation of rows and columns is arbitrary and in other embodiments the rows are referred to as columns and the columns are referred to as rows.

Each row of cell array 600 has a separate logic connection line corresponding to logic connection line 514 of FIG. 5 and a separate memory word line corresponding to memory word line 516 of FIG. 5. For example, in FIG. 6, row 636 has logic connection line 1 (650) and memory word line 1 (658) and row 638 has logic connection line 2 (652) and memory word line 2 (660). Each column of cells has a separate logic bit line corresponding to logic bit line 512 of FIG. 5, a separate bit selection line corresponding to bit selection line 504 of FIG. 5, and a separate memory bit line corresponding to memory bit line 518 of FIG. 5. For example, column 637 has logic bit line 1 (654), bit selection line 1 (662), and memory bit line 1 (666) while column 639 has logic bit line 2 (656), bit selection line 2 (664), and memory bit line 2 (668).

In FIG. 6, cells 602, 604, 606 and 608 each contain a respective memory element 614, 616, 622 and 624. Each of these cells may be individually written to or read from using memory word lines 658 and 660, bit selection lines 662 and 664, and memory bit lines 666 and 668. Specifically, a memory element of a cell is written to or read from by first connecting the memory element to a respective memory bit line by setting a memory word line, such as memory word lines 658 and 660, in a first state to close the memory switching element that connects the memory element to the respective memory bit line. Once the memory element is connected to the memory bit line, the bit selection line and/or the memory bit line are placed in states to either write to the memory element or read from the memory element. In some embodiments, the bit selection line and the memory bit line are placed in states to pass a relatively low current through the memory element to read a value stored in the memory element and to pass a relatively high current through the memory element to write a value to the memory element.

For example, when memory word line 1 (658) is set to a first state, memory switching elements 626 and 628 of cells 602 and 604 close. This connects memory element 614 to memory bit line 1 (666) and connects memory element 616 to memory bit line 2 (668). A voltage or current may then be applied between bit selection line 1 (662) and memory bit line 1 (666) to write or read from memory element 614. A voltage or current may also be applied between bit selection line 2 (664) and memory bit line (668) to write or read from memory element 616. Cells in row 638 may similarly be individually written to and read from using memory word line 2 (660), memory bit lines 666 and 668 and bit selection lines 662 and 664. The "first state" that the memory word lines are set to in order to close the memory switching elements is dependent on the type of memory switching element that is used and under various embodiments the "first state" can include a high voltage state, low voltage state, high current state or low current state, for example.

Each of the cells in FIG. 6 may also be used as part of a logic device. In FIG. 6, logic devices are constructed using cells in a common row. Thus, the cells in row 636 may be combined to form logic devices and the cells in row 638 may be combined to form logic devices. For example, setting logic bit line 1 (654) and logic bit line 2 (656) to a first state causes logic switching element 610 of cell 602 and logic switching element 612 of cell 604 to close and thereby connect memory element 614 of cell 602 to memory element 616 of cell 604 through logic connection line 1 (650). This allows memory elements 614 and 616 to be used as part of a logic device. Similarly, setting logic bit line 1 (654) and logic bit line 2 (652) to the first state causes logic switching element 618 and 620 of cells 606 and 608 to close thereby connecting memory element 622 to memory element 624 through logic connection line 2 (652). This allows memory element 622 and memory element 624 to operate as part of a logic device. The "first state" that the logic bit lines are set to in order to close the logic switching elements is dependent on the type of logic switching element that is used and under various embodiments the "first state" can include a high voltage state, low voltage state, high current state or low current state, for example.

As shown in FIG. 6, cell array 600 can be configured to provide for parallel execution of multiple logic devices at a same time. In particular, each row in the cell can implement a separate logic device or logic function using the logic bit lines. For example, using logic bit lines 654 and 656, a logic device can be constructed from cells 602 and 604 in row 636 and separate logic device can be constructed from cells 606 and 608 in row 638. Currents or voltages can then be set on bit selection line 1 (662) and bit selection line 2 (664) to execute the logic functions in each of the rows at the same time. For example, for a cell array having one thousand rows, one thousand simultaneous NAND operations could be performed. Each NAND operation would be based on independent input values, such that although the NAND operations are performed in parallel at the same time, different NAND operations can produce different outputs based on their respective input values. This allows for massive parallel computation.

Figure 7:
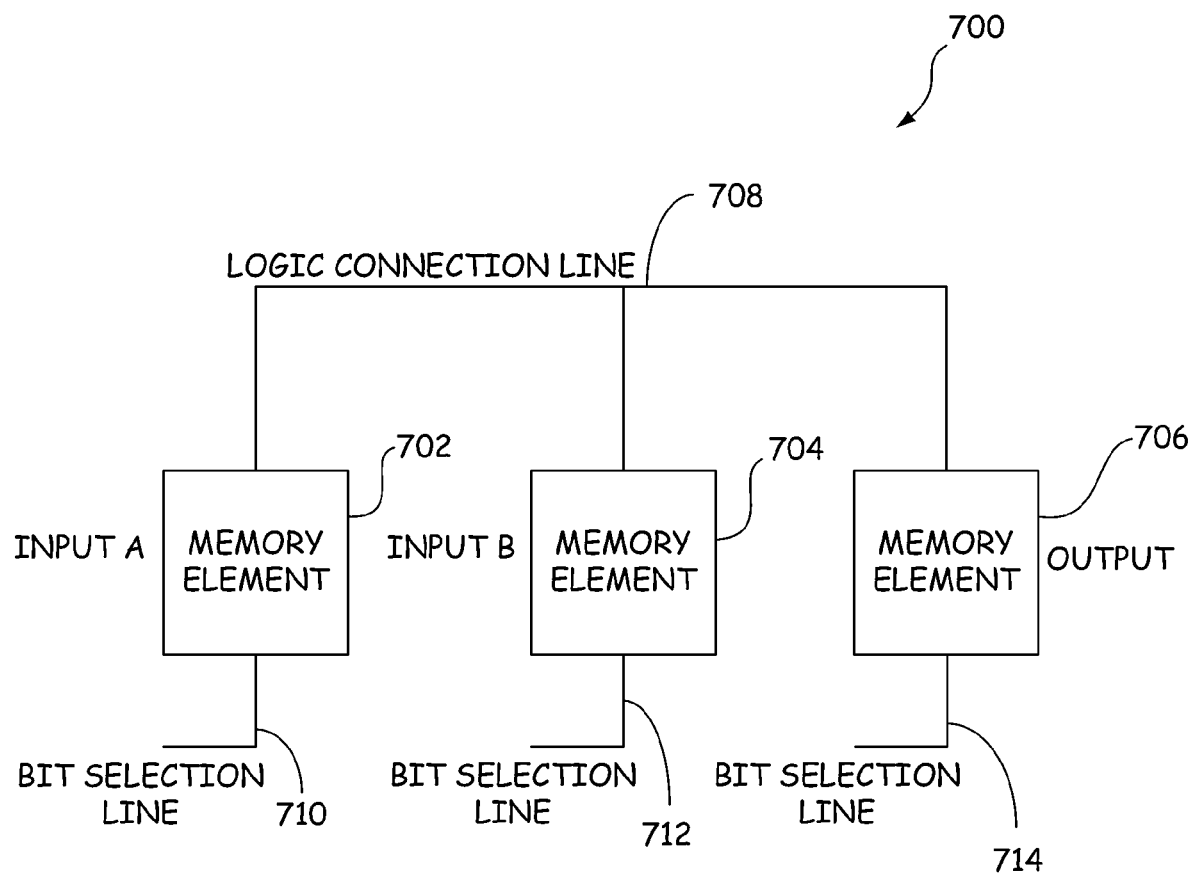
FIG. 7 shows an example of a logic device implemented using the cell array of FIG. 6.

FIG. 7 shows an example of a logic device 700 implemented using the cell array of FIG. 6. In FIG. 7, the logic switching elements are not shown for simplicity but their states are implied by the connections shown. Logic device 700 is constructed using select cells in a row of cells from the cell array. In FIG. 7, the memory element of each selected cell is shown such as memory elements 702, 704 and 706. Each of the logic switching elements between memory element 702, memory element 704 and memory element 706 and logic connection line 708 are shown as being closed such that memory element 700, memory element 702 and memory element 704 are connected together by logic connection line 708 to form logic device 700. In FIG. 7, other memory elements are prevented from being part of the input device by controlling the state of the logic bit line of those other memory elements. In particular, for each memory element that is not to be part of the logic device/logic function, the state of the memory element's logic bit line is set so that the logic switching device associated with the memory element is open. In addition to closing the logic switching elements of memory elements 702, 704 and 706, the embodiment of FIG.

7 opens the memory switching elements associated with memory elements 702, 704, and 706. In accordance with the embodiments discussed above, this is achieved by setting the state of the memory word line for the row of cells so that the memory switching elements of each cell in the row are open. With the memory switching elements open, memory elements 702, 704, and 706 are not in a memory mode.

The particular logic device implemented by FIG. 7 is dependent on the voltages applied to bit selection line 710, bit selection line 712 and bit selection line 714 and to the states of memory elements 702, 704 and 706. For example, memory element 702 may be used as a first input to logic device 700, memory element 704 may be used as a second input to logic device 700 and memory element 706 may be used as the output of logic device 700. In such a configuration, the possible logic devices that could be formed when the memories are MTJs would be controlled by the preset state of memory element 706 and the voltages applied between bit selection line 714 and bit selection lines 710 and 712 in accordance with FIG. 3.

Although memory element 706 is shown as an output element in FIG. 7, after it has had its value set through the operation of logic device 700, it may be connected to other memory elements using logic connection line 708 to form a new logic device and thereby act as an input to another logic device. Alternatively or additionally, memory element 706 may be read by operating the memory in the memory mode by closing the memory switching element between memory element 706 and the memory bit line associated with memory element 706.

Figure 8:
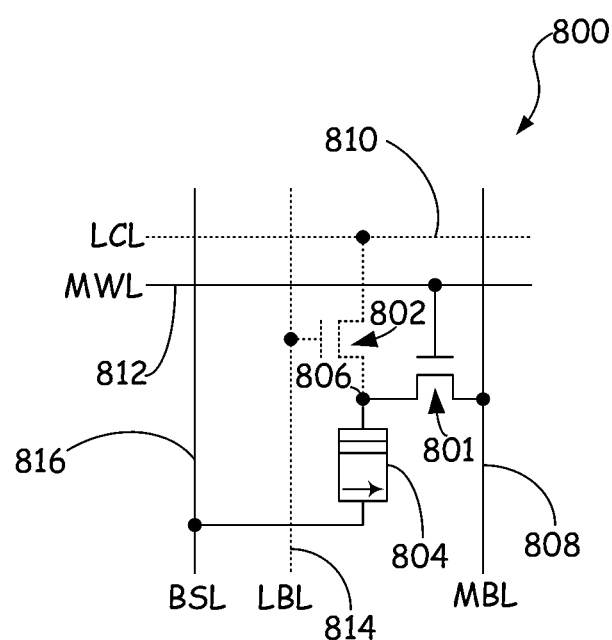
FIG. 8 provides an example of a 2T1M cell using MTJ.

To implement CRAM using MRAM technology, one embodiment utilizes the cell architecture 800 shown in FIG. 8, which is referred to herein as a 2T1M (2 Transistor, 1 Memory) cell. The 2T1M cell includes a memory access transistor 801, a logic access transistor 802 and a MTJ 804. Memory access transistor 801 acts as memory switching element 510 of FIG. 5, logic access transistor 802 acts as logic switching element 508 of FIG. 5, and MTJ 804 acts as memory element 502 of FIG. 5. Although a magnetic tunneling junction is shown as the memory element in FIG. 8, any device capable of having its resistance changed by the application of a current can be used as memory element 804. The drains of memory access transistor 801 and logic access transistor 802 are connected to MTJ 804 at common node 806. The source of memory access transistor 801 is connected to memory bit line (MBL) 808 and the source of logic access transistor 802 is connected to logic connection line (LCL) 810. The gate of memory access transistor 801 is connect to memory word line (MWL) 812 and controls whether current flows between the source and drain of memory access transistor 801. The gate of logic access transistor 802 is connected to logic bit line (LBL) 814 and controls whether current flows between the source and drain of logic access transistor 802. MTJ 804 is connected between common node 806 and bit selection line (BSL) 816.

The 2T1M cell is similar to a 1T1M MRAM cell in terms of memory function. However, the 2T1M cell includes an additional transistor 802 to allow for logic operations and to act as a switching element to logic connection line (LCL) 810. When the memory word line (MWL) 812 is set to a high state and the logic bit line (LBL) 814 is set to a low state, cell 800 behaves identically to the 1T1M MRAM cell, and the MTJ is accessible for read/write operations across bit selection line (BSL) 816 and memory bit line (MBL) 808. However, when logic bit line (LBL) 814 is in a high state and memory word line (MWL) 812 is in a low state, logic access transistor 802 connects MTJ 804 to logic connection line (LCL) 810 and cell 800 can be accessed for Voltage Controlled Logic (VCL) operations using bit selection line (BSL) 816.

Figure 9:
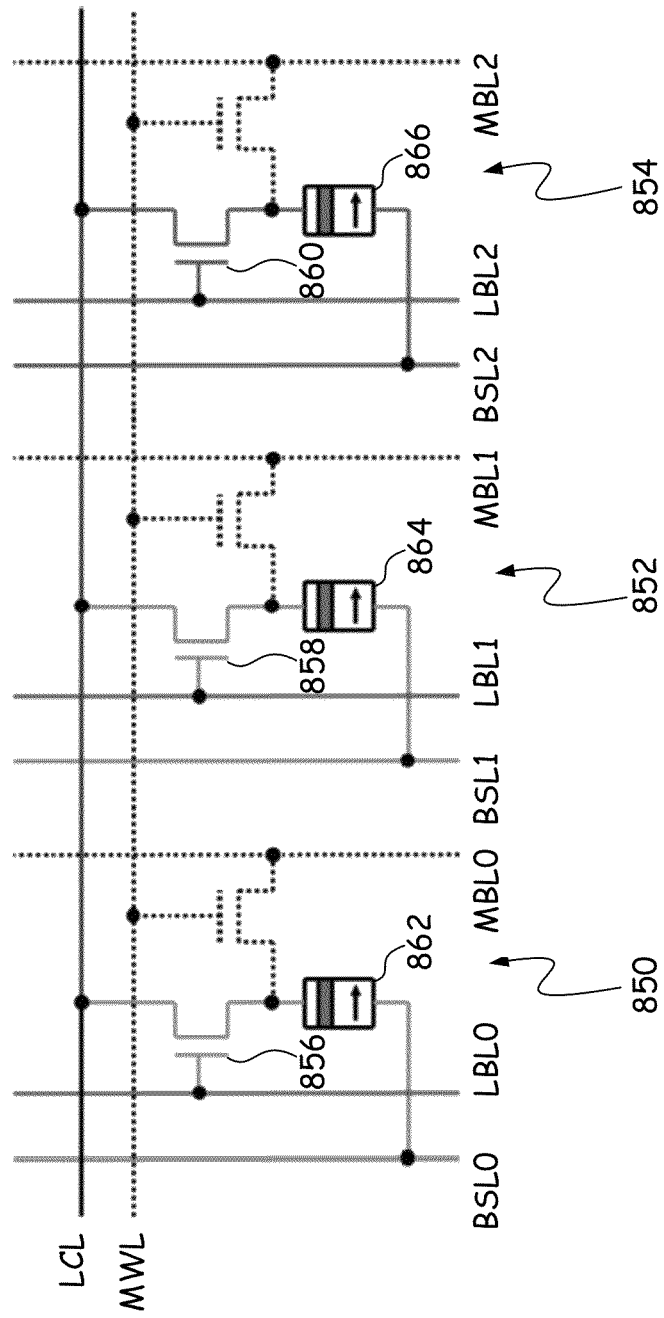
FIG. 9 shows a 2-input CRAM gate that is functionally equivalent to the 2-input VCL gate presented in FIG. 2.

FIG. 9 shows a 2-input CRAM gate that is functionally equivalent to the 2-input VCL gate presented in FIG. 2. For a logic operation, the first two cells 850 and 852 are loaded with the input data, either from a previous CRAM operation or by writing the data using the memory mode. Cell 854 acts as the output for the logic operation. LBL0, LBL1, and LBL 2 are set to high states cells 850, 852 and 854, thereby causing transistors 856, 858 and 860 to connect respective memory elements 862, 864 and 866 to the logic connection line (LCL). A voltage pulse is applied to BSL2 while BSL0 and BSL1 are grounded. Different logic operations can be realized according to the magnitude and order of the voltage pulses. Because all cells in the array are identical, inputs and outputs are arbitrary, and are defined only by the order of voltage pulses, not the physical structure. This allows for the function of CRAM to be entirely reprogrammable.

Figure 10:
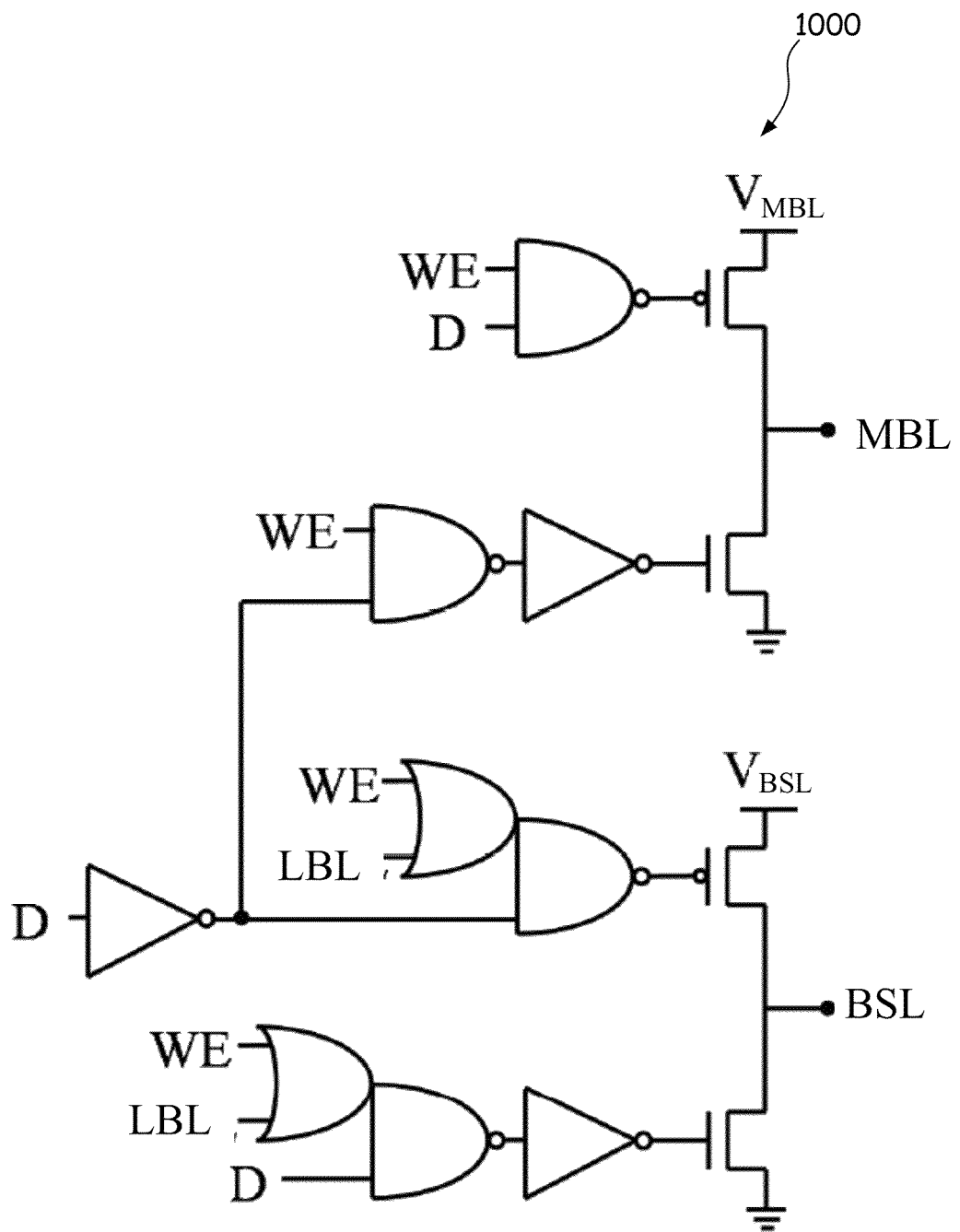
FIG. 10 provides a block diagram of a BSL driver.

FIG. 10 provides an example of a driver 1000 that can be used to set voltages on memory bit lines (MBL) and bit select lines (BSL) during logic operations and memory write operations. Driver 1000 receives three inputs: a write enable (WE), a logic value for the bit selection line (D), and the logic bit line value (LBL). During logic operations, LBL will be in a high state and during memory operations, LBL will be in a low state. WE will be in a high state when writing values to one or more memory elements during memory operations and will be in a low state otherwise. D is used to control the voltage applied to the memory bit line (MBL) during memory write operations and to control the voltage applied to the bit select line (BSL) during both memory write operations and logic operations.

In the example of FIG. 10, when LBL is low, WE is high and D is high, driver 1000 provides voltage $V_{MBL}$ to the memory bit line and ground to the bit selection line, causing current to flow through the memory element in a first direction thereby writing a first value to the memory element. When LBL is low, WE is high and D is low, driver 1000 provides ground to the memory bit line and voltage $V_{BSL}$ to the bit selection line, causing current to flow through the memory element in a second direction, thereby writing a second value to the memory element. When LBL is high and D is high, driver 1000 provides ground to the bit selection line during a logic operation and when LBL is high and D is low, driver 1000 provides $V_{BSL}$ to the bit selection line during a logic operation.

Figure 11:
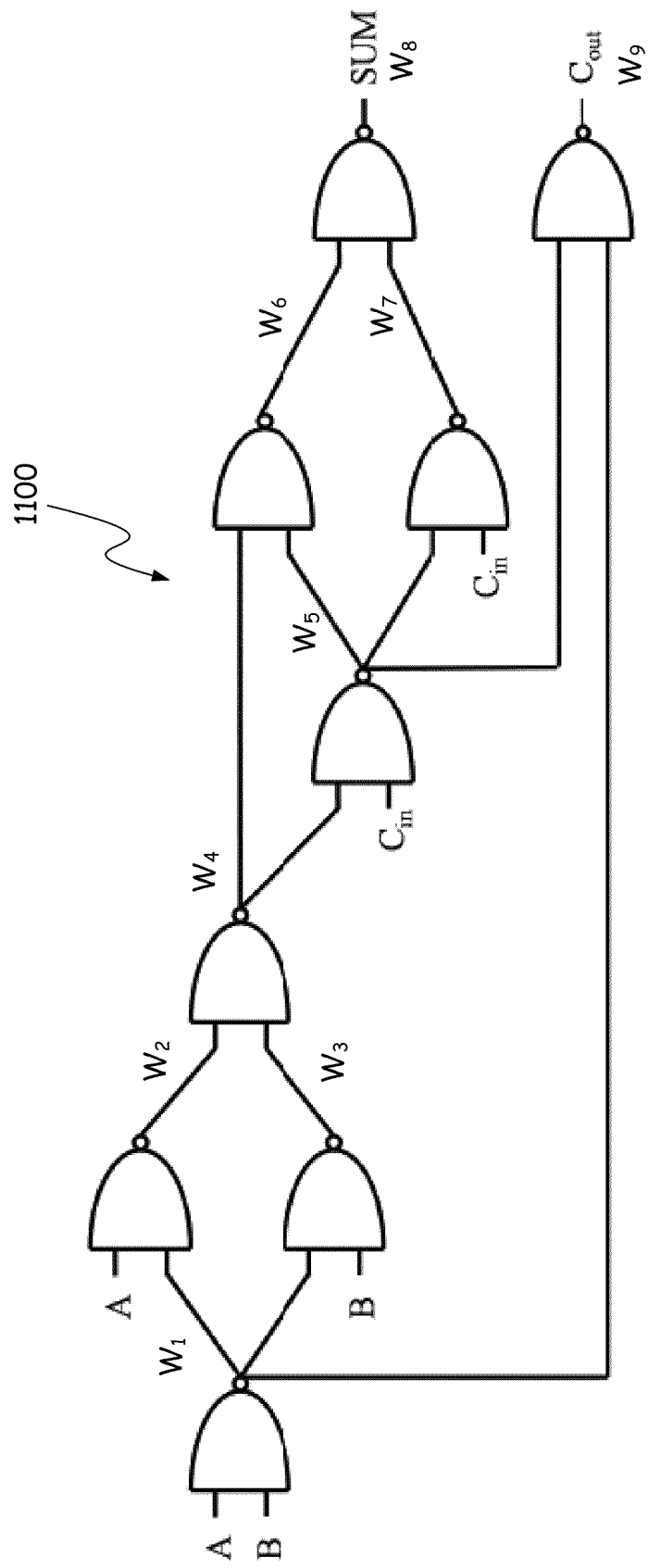
FIG. 11 provides a block diagram of a full-adder.

FIG. 11 provides an example of a single full-adder 1100 constructed from 9 NAND gates. Adder 1100 receives single input bit values A and B and a carry-in bit value $C_{in}$, adds the three values together and provides a SUM and a carry-out value $C_{out}$. In order to use the CRAM processor to accomplish logic operations represented by adder 1100, there needs to be a working register attached to the memory word line (MWL) for each NAND gate output. For adder 1100, this requires nine working registers $W_1$-$W_9$.

Figure 12:
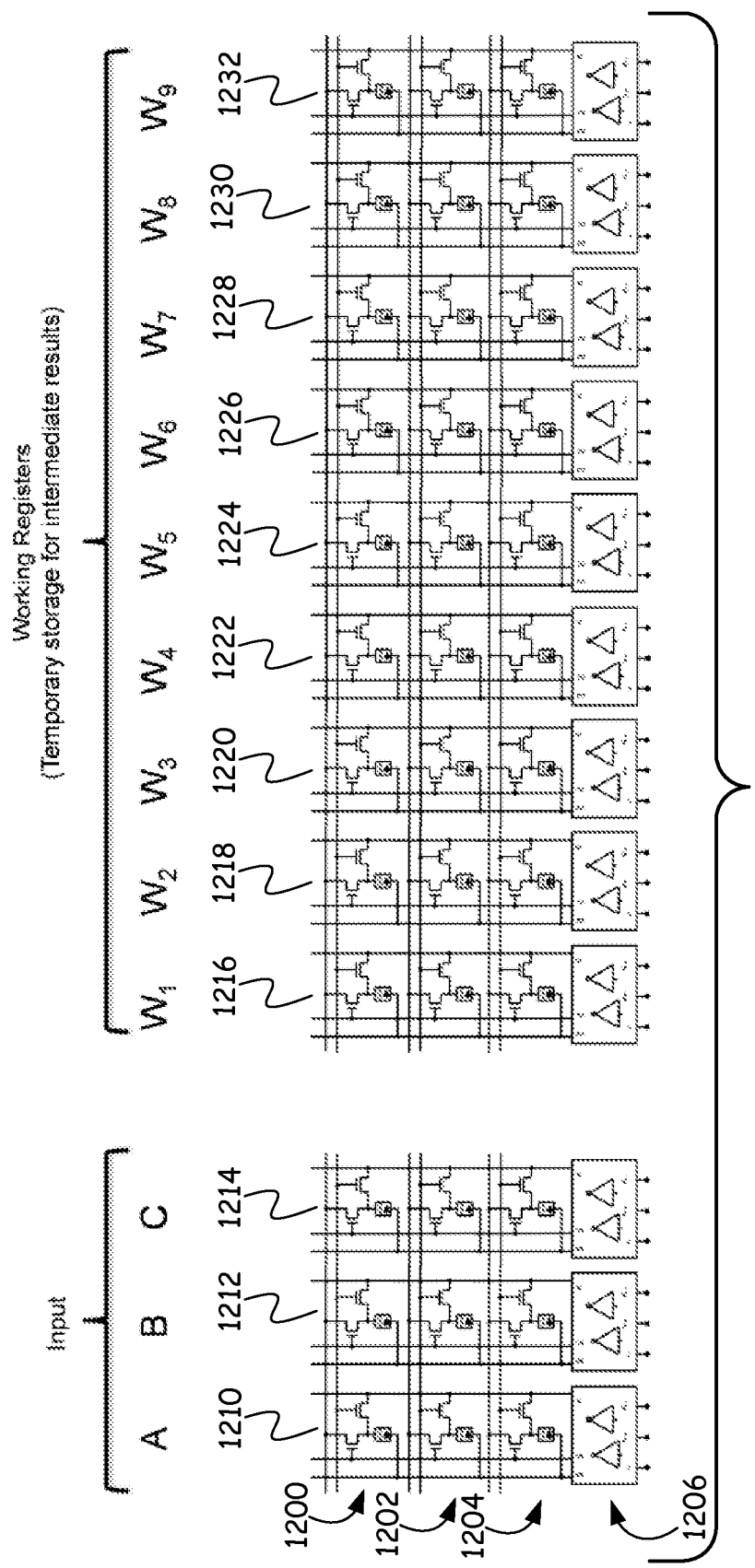
FIG. 12 provides a diagram of input cells and working register cells to implement the full-adder of FIG. 11.

FIG. 12 provides a cell array showing three rows of cells 1200, 1202, 1204, and a row of drivers 1206, that can be used to implement three parallel adders such as full-adder 1100 of FIG. 11. Although three single bit adders are shown, any number of parallel single bit adders may be implemented by adding additional rows of cells. In addition, although only a two-input adder is depicted in FIGS. 11 and 12, multi-input adders may be implemented by adding additional cells for the input and additional working registers to accommodate the additional NAND gates required for larger numbers of inputs. As shown in FIG. 12, each row of cells includes a plurality of logic-memory cells, which in some exemplary embodiments each have cell architecture 800 of FIG. 8. Each row of cells includes a separate logic-memory cell for each input and the carry-in value, such as input cells 1210, 1212 and 1214 of row 1200, and a separate cell for each working register including the working register that will hold the SUM and the carry-out value, such as cells 1216, 1218, 1220, 1222, 1224, 1226, 1228, 1230, and 1232 or row 1200.

To implement full-adder 1100, input cells 1210, 1212 and 1214 are placed in memory mode by setting the memory word line for row 1200 in a first state to connect the memory elements of input cells 1210, 1212 and 1214 to a respective memory bit selection line. In other words, each memory element of a first set of memory elements is connected to a respective memory bit selection line of a first set of memory bit selection lines. A first set of bit selection lines corresponding to input cells 1210, 1212 and 1214 and the first set of memory bit selection lines are then set to states that cause the two input values and the carry-in value to be set in the memory elements of input cells 1210, 1212 and 1214.

The cells in row 1200 are then selectively connected to the logic connection line for row 1200 to perform the nine NAND operations required to implement full-adder 1100. For each NAND operation, this involves setting a set of logic bit lines to a first state to connect a corresponding set of memory elements to the logic connection line. After the memory elements are connected to the logic connection line, the set of bit selection lines corresponding to the connected memory elements are set to respective states to cause the set of memory elements to perform a logic function (in this case NAND, but the embodiments are not limited to NAND functions) and to store the result of the logic function in one of the memory elements in the set of memory elements.

Each logic operation can set a different set of logic bit lines to the first state to connect different sets of memory elements to the logic connection line at different times. In particular, a later set of memory elements can include a memory element that contains a result of a previous logic function. After the memory elements are connected to the logic connection line, the respective sets of bit selection lines are set to states that cause the memory elements to execute the logic operation (in this case NAND, but the embodiments are not limited to NAND functions).

Under one embodiment, full-adder 1100 is implemented by connecting cells of FIG. 12 in the following sequence:

TABLE 1

| NAND OPERATION | INPUT 1 | INPUT 2 | OUTPUT |
| --- | --- | --- | --- |
| 1 | A - Cell 1210 | B - Cell 1212 | WR1 - Cell 1216 |
| 2 | A - Cell 1210 | WR1 - Cell 1216 | WR2 - Cell 1218 |
| 3 | B - Cell 1212 | WR1 - Cell 1216 | WR3 - Cell 1220 |
| 4 | WR2 - Cell 1218 | WR3 - Cell 1220 | WR4 - Cell 1222 |
| 5 | WR4 - Cell 1222 | $C_{in}$ - Cell 1214 | WR5 - Cell 1224 |
| 6 | WR4 - Cell 1222 | WR5 - Cell 1224 | WR6 - Cell 1226 |
| 7 | WR5 - Cell 1224 | $C_{in}$ - Cell 1214 | WR7 - Cell 1228 |
| 8 | WR6 - Cell 1226 | WR7 - Cell 1228 | WR8 - Cell 1230 |
| 9 | WR5 - Cell 1224 | WR1 - Cell 1216 | WR9 - Cell 1232 |

As shown in Table 1, many of the cells are used as both an output of one NAND operation and an input of one or more other NAND operations. For example, working register cell 1216 receives the output of the first NAND operation and then supplies that output as an input for NAND operations 2, 3, and 5. Thus, the same memory element is used as both an output of a logic function and an input to other logic functions.

Although the example above uses the working registers to only store one value, in more complicated logic operations, these working registers can be reused and hold multiple different output values.

In FIG. 12, it can be seen that when the logic bit lines are set to a first state, they cause memory elements in each of the rows, such as rows 1200, 1202 and 1204, to connect to a respective logic connection line for the row. As a results, sets of memory elements in each row perform the same logic function at the same time and store a result of the logic function in one of the memory elements of the row.

To demonstrate the concept and the power efficiency of a MRAM-based CRAM processor, multi-bit addition operations were performed so the power delay product (PDP) of the MRAM-based CRAM processor could be compared with a CMOS implementation of a Brent-Kung adder. The MTJs were modeled using a macromodel and only 2-input NAND gates were used in the simulation.

Figure 13:
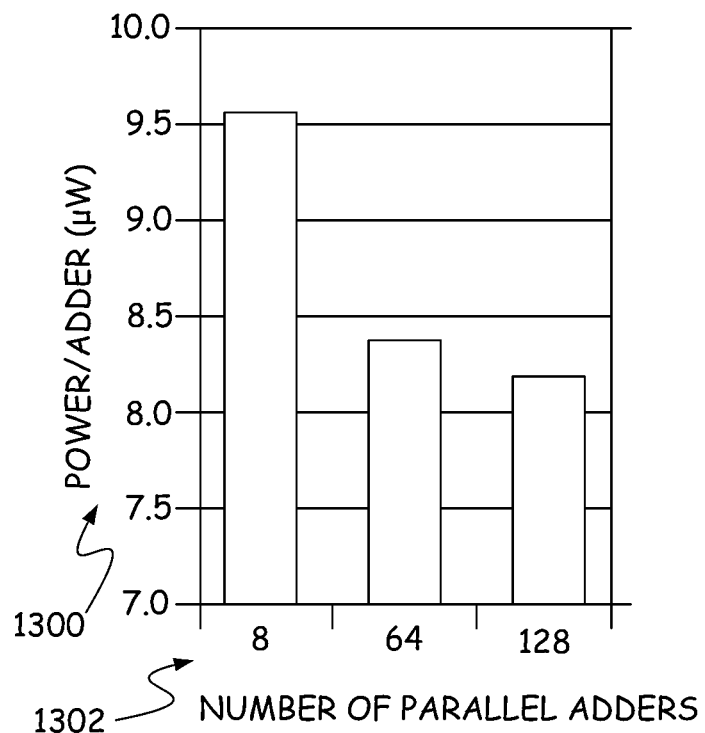
FIG. 13 provides a graph of power/adder for different numbers of parallel CRAM adders.

FIG. 13 shows the power/adder results for the CRAM processor. As shown in FIG. 13, the average power per adder 1300 reduces as the number of adders (wordlines) 1302 increases. This is for two reasons. First, the partially fixed cost of the CMOS overhead for the drivers is distributed over a larger number of adders, and therefore the CMOS overhead per adder is reduced. Second, the MTJs used for the simulation have a resistance of 22 kΩ, therefore, by themselves, they have a poor impedance match with the CMOS drivers. However, as the number of parallel cells increases, the impedance of the entire BSL better matches the output impedance of the BSL driver. We can see that with 128 cells, the power/adder reduces to only 8.19 μW at 100 MHz.

Figure 14:
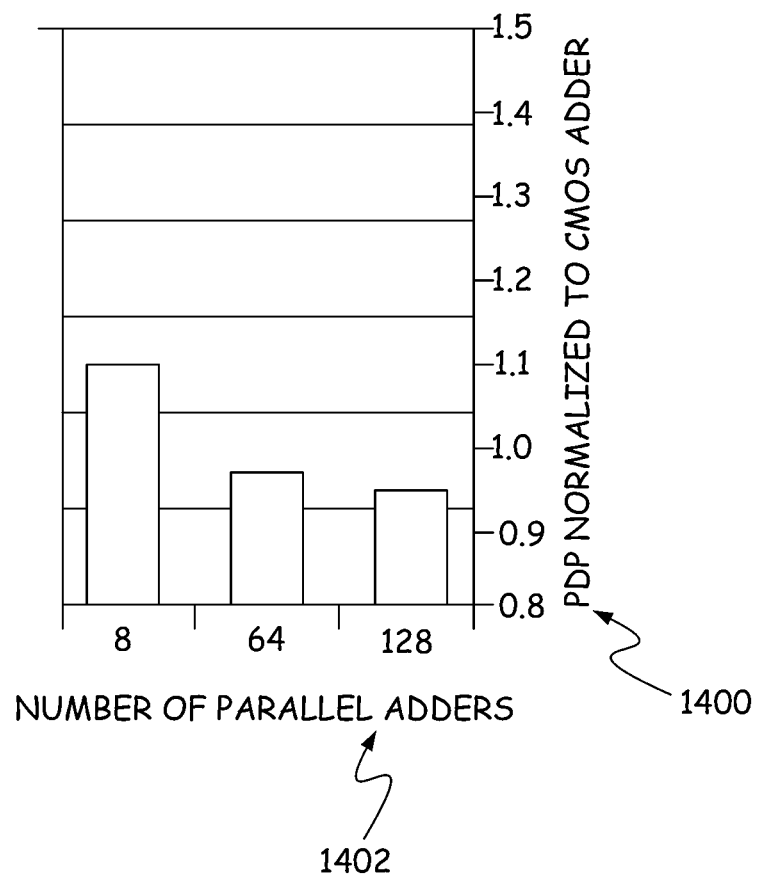
FIG. 14 provides a graph of power delay product for different numbers of parallel CRAM adders.

FIG. 14 shows the power delay product of the CRAM processor for different numbers of parallel adders. In FIG. 14, the power delay product (PDP) normalized to the PDP of a CMOS adder is shown on vertical axis 1400 and the number of parallel adders is shown on horizontal axis 1402. The 16 bit CRAM adder had a PDP of 1.31 pJ whereas the CMOS adder had a PDP of 1.39 pJ. While a CMOS processor would require memory, buffers, transmission lines, and an ALU, all of these are incorporated into the memory of the CRAM processor. The entire CRAM processor uses 6% less power than the adder alone. According to our calculations, a MRAM-based CRAM processor with 128,000 parallel adders operating at 100 MHz would have the computational power of a 400 GHz adder, but consume only 1 W.

The CRAM processor offers its greatest benefit for massively parallel operations, where it could enable a significant increase in performance over today's CMOS processor designs. The CRAM architecture is ideally suited for many types of operations, including all fixed point operations and many floating point operations, with potential applications in high definition video processing and particle physics simulations.

In summary, we demonstrate a new CRAM architecture. In accordance with on embodiment, we develop a 2T1M cell that utilizes the linear combination of state variables and utilizes the threshold behavior of MTJs to perform computation inside the memory array. There are significances for this work. First, unlike today's processor architecture which requires operands to be fetched from memory, operated on, and stored back into memory, there is no interconnect loss for our proposed CRAM architecture. What would have taken a memory retrieval, interconnect transmission, computation, another interconnect transmission, and finally a memory write now occurs at approximately the same energy of only the memory write. All of the other steps are skipped. Second, because the logic device is also randomly accessible, it is highly compatible with decades of computer science research. Another advantage of the CRAM architecture is its regular pattern. CMOS logic layouts are inherently irregular and low density. Because our architecture is based on a memory array, it is the densest pattern possible for any layout. Furthermore, the 2T1M cell, containing only two transistors, replaces the functionality of a four transistor logic gate and a six transistor memory cell. The CRAM architecture is capable of surpassing the most compact CMOS logic in both performance and density. In addition, the cell array of the various embodiments allows logic devices to be constructed "on the fly" with elements that were used as outputs in one device becoming inputs in a next device. Thus, the cell array becomes a programmable device array allowing the functions of the memory elements to be altered as needed.

Analysis of the CRAM processor was performed in HSPICE. The MTJs were modeled using a macromodel with W×L, RA, Jc0, and TMR being 30 nm×30 nm, 20 µm2, 1.5 MA/cm2, and 300% respectively. For the CMOS devices, the FreePDK45 was used. In addition to the CRAM processor, a 16 Bit Brent-Kung adder was designed and simulated to allow for a 1:1 power and PDP comparison using the same FreePDK45.

First, the voltage margins for a 2 bit NAND operation was measured using a supply voltage of 0.8V. In one embodiment, the voltage margin for a NAND operation was 330 mV. By increasing the supply voltage to 1.8V the voltage margin increases to 470 mV. For the 3-input NAND gate operating at 0.8V, the voltage margin is 180 mV. While majority (MAJ) logic has not been frequently utilized in CMOS architectures (because it is inefficient to realize MAJ using CMOS), some circuits can be significantly reduced in complexity by expressing them in terms of 3-input MAJ gates.

To simulate the operation of the CRAM processor, data was loaded into the input memory while WE was high and the memory word lines MWLs were used to select the appropriate word. After the data was loaded, the drivers were switched to logic mode, and all the MWLs were driven low. During this phase, all of the BSLs are driven by the BSL input from the drivers. A series of operation vectors were applied to D[0:24]. The order and value of these operation vectors determines the logic operation performed. For simulation purposes, we performed a 16-bit addition so the PDP of the CRAM processor could be compared with a CMOS implementation of a Brent-Kung adder.

Although the present invention has been described with reference to preferred embodiments, workers skilled in the art will recognize that changes may be made in form and detail without departing from the spirit and scope of the invention.

What is claimed is:

1. A cell array comprising:
   a logic connection line;
   a plurality of bit selection lines;
   a plurality of cells, each cell comprising:
      a memory element connected to a respective bit selection line; and
      a logic switching element that selectively connects the memory element to the logic connection line;
   wherein when logic switching elements of multiple separate cells connect their respective memory elements to the logic connection line, the memory elements connected to the logic connection line operate as a logic device with an output of the logic device stored in one of the memory elements.

2. The cell array of claim 1 wherein each memory element comprises a non-volatile memory element.

3. The cell array of claim 1 wherein when logic switching elements of n separate cells connect their respective memory elements to the logic connection line, the memory elements connected to the logic connection line operate as an n−1 logic device with an output of the logic device stored in one of the memory elements.

4. The cell array of claim 3 wherein when logic switching elements of 3 separate cells connect their respective memory elements to the logic connection line, the memory elements connected to the logic connection line operate as a 2-input logic device with an output of the logic device stored in one of the memory elements.

5. The cell array of claim 1 further comprising:
   a plurality of memory bit lines; and
   each cell further comprises a memory switching element that selectively connects the memory element to a respective memory bit line;
   wherein when a memory switching element connects a memory element to a respective memory bit line, a state of the memory element can be determined.

6. The cell array of claim 5 wherein when a memory switching element connects a memory element to a respective memory bit line, a state of the memory element can be set.

7. The cell array of claim 1 wherein the cell array further comprises:
   a plurality of logic connection lines, each logic connection line selectively connectable to a respective plurality of cells where each cell comprises:
      a memory element connected to a respective bit selection line; and
      a logic switching element that selectively connects the memory element to the logic connection line;
   wherein for each logic connection line, when logic switching elements of multiple separate cells connect their respective memory elements to the logic connection line, the memory elements connected to the logic connection line operate as a logic device with an output of the logic device stored in one of the memory elements.

8. The cell array of claim 7 wherein at least one of the plurality of bit selection lines is connected to a plurality of memory elements in a plurality of respective cells.

9. The cell array of claim 7 wherein, the logic devices formed by connecting the memory elements to the plurality of logic connection lines operate in parallel.

10. A logic-memory cell comprising:
   a first transistor connected between a logic connection line and a common node and connected to a logic bit line;
   a second transistor connected between a memory bit line and the common node and connected to a memory word line; and
   a device capable of having its resistance changed by a current, the device connected between the common node and a bit selection line.

11. The logic-memory cell of claim 10 wherein the device comprises a magnetoresistance device having a fixed magnetic layer, a free magnetic layer and a non-magnetic spacer layer.

12. The logic-memory cell of claim 11 wherein the magnetoresistance device comprises a magnetic tunnel junction.

13. The logic-memory cell of claim 10 wherein when the logic bit line is in a first state, the first transistor connects the logic connection line to the common node and when the logic bit line is in a second state, the first transistor disconnects the logic connection line from the common node.

14. The logic-memory cell of claim 10 wherein when the memory word line is in a first state, the second transistor connects the memory bit line to the common node and when the memory word line is in a second state, the second transistor disconnects the memory bit line from the common node.

15. A method comprising:
- setting a first set of logic bit lines to a first state to connect a first set of memory elements to a logic connection line; and
- setting a first set of bit selection lines to respective states to cause the first set of memory elements to perform a first logic function and to store a result of the first logic function in one of the first set of memory elements.

16. The method of claim 15 further comprising:
- setting a second set of logic bit lines to the first state to connect a second set of memory elements to the logic connection line, the second set of memory elements comprising the memory element in which the result of the first logic function is stored;
- setting a second set of bit selection lines to respective states to cause the second set of memory elements to perform a second logic function, wherein the memory element in which the result of the first logic function was stored provides an input to the second logic function.

17. The method of claim 15 further comprising before setting the first set of logic bit lines to a first state:
- setting a memory word line to a first state to connect each memory element in the first set of memory elements to a respective memory bit selection line of a first set of memory bit selection lines; and
- setting the first set of bit selection lines and the first set of memory bit selection lines to states to set a respective value in at least one of the first set of memory elements.

18. The method of claim 15 wherein setting the first set of logic bit lines to the first state also connects a second set of memory elements to a second logic connection line.

19. The method of claim 18 wherein setting the first set of bit selection lines to respective states cause the second set of memory elements to perform the first logic function and to store a result of the first logic function in one of the second set of memory elements.

20. The method of claim 19 wherein the first logic function comprises a two-input one-output logic function.

* * * * *